US009928332B1

(12) United States Patent
Van Dyken

(10) Patent No.: US 9,928,332 B1
(45) Date of Patent: Mar. 27, 2018

(54) SYSTEMS AND METHODS FOR TIME-MULTIPLEXED SYNCHRONOUS LOGIC

(71) Applicant: Altera Corporation, San Jose, CA (US)

(72) Inventor: John Curtis Van Dyken, Caledon East (CA)

(73) Assignee: Altera Corporation, San Jose, CA (US)

( * ) Notice: Subject to any disclaimer, the term of this patent is extended or adjusted under 35 U.S.C. 154(b) by 64 days.

(21) Appl. No.: 14/946,227

(22) Filed: Nov. 19, 2015

(51) Int. Cl.
*G06F 17/50* (2006.01)
*H03K 19/17* (2006.01)
*H03K 19/177* (2006.01)

(52) U.S. Cl.
CPC ........ *G06F 17/5072* (2013.01); *G06F 17/505* (2013.01); *G06F 17/5068* (2013.01); *H03K 19/1774* (2013.01); *H03K 19/17728* (2013.01); *H03K 19/17736* (2013.01); *H03K 19/17744* (2013.01); *H03K 19/17752* (2013.01); *H03K 19/17756* (2013.01)

(58) Field of Classification Search
CPC ....... H03K 19/17728; H03K 19/17736; H03K 19/1774; H03K 19/17744; H03K 19/17752; H03K 19/17756; G06F 17/5045; G06F 17/5054; G06F 17/5068
USPC .......................... 326/37–39, 41; 716/116–117
See application file for complete search history.

(56) References Cited

U.S. PATENT DOCUMENTS

| | | | | |
|---|---|---|---|---|
| 5,838,954 A | * | 11/1998 | Trimberger | G06F 17/5054 716/108 |
| 7,406,573 B2 | * | 7/2008 | Huppenthal | G06F 15/7867 326/41 |
| 2002/0188914 A1 | * | 12/2002 | Parashkevov | G06F 17/5022 716/103 |
| 2004/0006584 A1 | * | 1/2004 | Vandeweerd | G06F 9/5066 718/107 |
| 2009/0066366 A1 | * | 3/2009 | Solomon | G06F 15/17387 326/41 |
| 2009/0219051 A1 | * | 9/2009 | Zhang | H03K 19/17752 326/38 |
| 2010/0017185 A1 | * | 1/2010 | Bade | G06F 17/5022 703/13 |
| 2010/0058261 A1 | * | 3/2010 | Markov | G06F 17/5045 716/106 |
| 2010/0287522 A1 | * | 11/2010 | Oktem | G06F 17/5045 716/103 |
| 2012/0174053 A1 | * | 7/2012 | Markov | G06F 17/5045 716/134 |

(Continued)

OTHER PUBLICATIONS

Halfhill, "Tabula's Time Machine," Microprocessor Report, Mar. 29, 2010, retrieved from the internet at http://caxapa.ru/thumbs/258641/M11_Tabula_Reprint.pdf, 14 pages.

*Primary Examiner* — Stacy Whitmore
(74) *Attorney, Agent, or Firm* — Fletcher Yoder P.C.

(57) ABSTRACT

Systems and methods for time-multiplexed synchronous logic provide an enhanced time delay multiplexing (TDM) scheme that includes soft TDM logic generated by computer-aided design (CAD) tools to actualize a circuit design with improved density. The CAD tools can be used to utilize inherent regularity to devise time multiplexing user logic. The CAD can generate soft TDM hardware to realize a circuit design with improved density.

18 Claims, 12 Drawing Sheets

(56) References Cited

U.S. PATENT DOCUMENTS

| | | | | |
|---|---|---|---|---|
| 2013/0099821 A1* | 4/2013 | Huang | ............... | G06F 17/5054 |
| | | | | 326/41 |
| 2013/0104093 A1* | 4/2013 | Huang | ............... | G06F 17/5054 |
| | | | | 716/120 |
| 2013/0135008 A1* | 5/2013 | Zhang | .................. | B82Y 10/00 |
| | | | | 326/41 |
| 2013/0176052 A1* | 7/2013 | Hutton | ............ | H03K 19/17764 |
| | | | | 326/41 |
| 2014/0059282 A1* | 2/2014 | Zhang | ............ | H03K 19/17752 |
| | | | | 711/104 |
| 2014/0285233 A1* | 9/2014 | Natarajan | ...... | H03K 19/017581 |
| | | | | 326/38 |
| 2015/0311899 A1* | 10/2015 | Karras | ............... | G06F 17/5068 |
| | | | | 326/41 |
| 2017/0017476 A1* | 1/2017 | Ebcioglu | ............ | G06F 17/5045 |

* cited by examiner

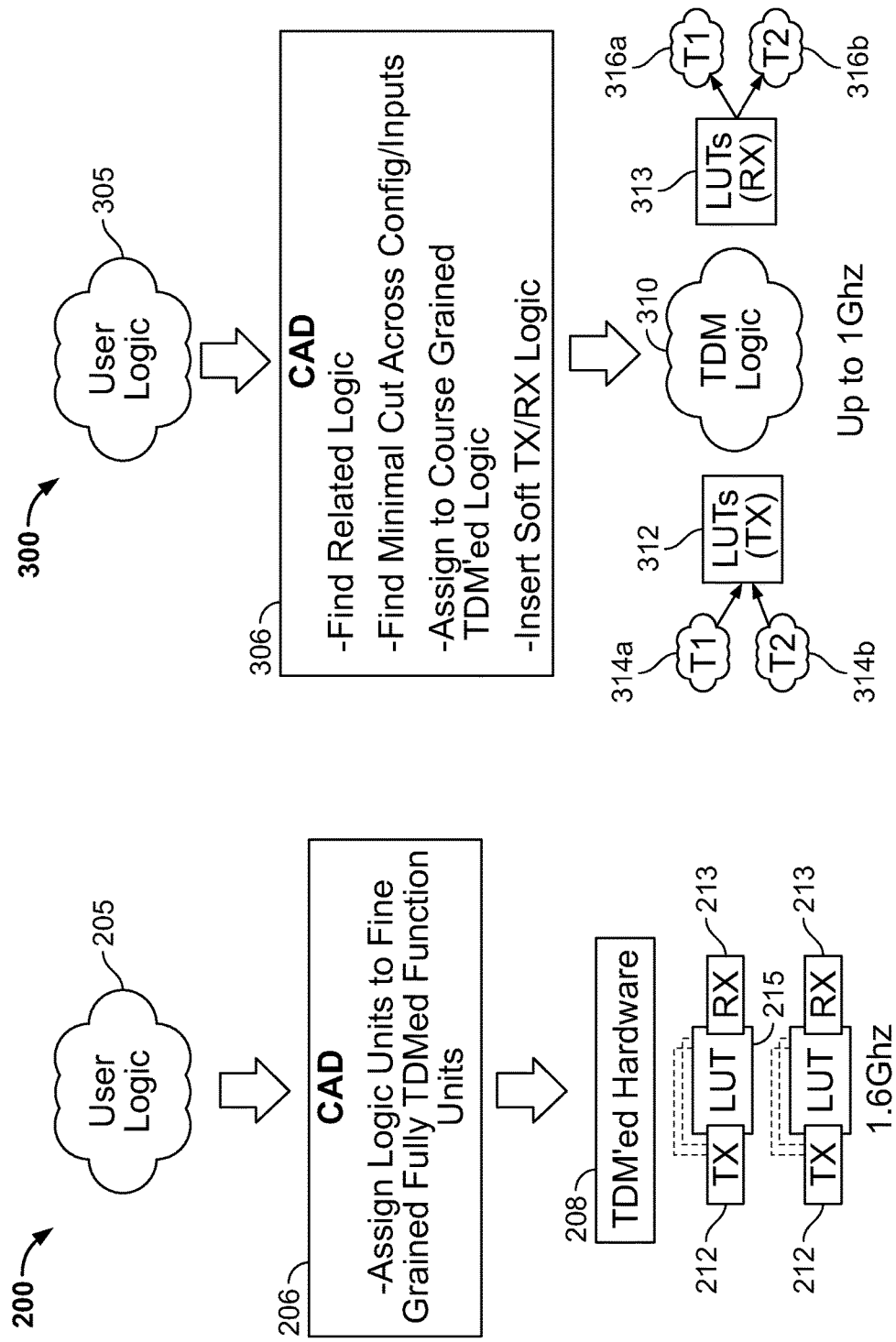

SYSTEMS AND METHODS FOR TIME-MULTIPLEXED SYNCHRONOUS LOGIC

FIELD OF THE INVENTION

This invention relates to an enhanced time delay multiplexing (TDM) scheme that includes soft TDM logic generated by computer-aided design (CAD) tools to actualize a circuit design with increased density.

BACKGROUND OF THE INVENTION

Time delay multiplexing (TDM) provides a way of sharing a communication link. A communication channel is divided into a number of digital channels or data streams such that the link sharing can be adapted to the traffic demands of the data streams. TDM can be used to share resources across time.

Some existing circuit architecture can increase throughput of a time-multiplexed circuit by exploiting a vast set of light weight flip-flops (FFs). For example, by duplicating the datapath and/or pipelines, the throughput of a circuit can be doubled. The duplication method, however, can be impractical for circuits with more complicated control logic, because it requires significant work to re-design and reproduce the duplicated circuit part. Other methods to improve the throughput include using designated hardware to implement a pre-designed and fixed TDM architecture in order to increase the density of a device. The designated hardware can incur a fixed architectural overhead to the circuit, such as extra hardware to swap between time slices in order to implement the TDM scheme.

SUMMARY OF THE INVENTION

In accordance with embodiments of the present invention, an enhanced time delay multiplexing (TDM) scheme that includes soft TDM logic generated by computer-aided design (CAD) tools to actualize a circuit design with improved density is provided. CAD tools can be used to utilize inherent regularity to devise time multiplexing user logic. The CAD can generate soft TDM hardware to realize a circuit design with improved density.

Therefore, in accordance with embodiments of the present invention there is provided a method for multiplexing a logic circuit in time domain. The method includes obtaining information relating to a plurality of logic circuit components. The method further includes selectively assigning a first logic circuit component and a second logic circuit component from the plurality of logic circuit components as a time-shared resource. The first logic circuit component and the second logic circuit component are related logic components. The method further includes connecting configurable logic with the time-shared resource. The configurable logic includes configurable receiver logic that receives an output from the time-shared resource and outputs to a plurality of output threads or configurable transmitter logic that transmits an input from a plurality of input threads to the time-shared resource.

In accordance with another embodiment of the present invention there is provided a method for multiplexing a logic circuit in time domain. The method includes obtaining information relating to a plurality of logic circuit components. The method further includes selectively creating one or more TDM logic models from the plurality of logic circuit components. The method further includes instantiating the one or more time-domain multiplexed logic models to obtain performance data. The method further includes comparing the performance data to select an optimal TDM logic model from the one or more TDM logic models.

In accordance with another embodiment of the present invention there is provided circuitry for multiplexing a logic circuit in time domain. The circuitry includes configurable transmitter soft logic receiving one or more input threads. The circuitry further includes TDM logic generated by selectively assigning one or more related logic components as a time-shared resource. The circuitry further includes configurable receiver soft logic outputting one or more output threads.

In accordance with another embodiment of the present invention there is provided a processor-readable non-transitory medium storing processor-executable instructions for multiplexing a logic circuit in time domain. The processor-executable instructions include instructions executable by a processor to obtain information relating to a plurality of logic circuit components. The processor-executable instructions further include instructions executable by the processor to selectively assign a first logic circuit component and a second logic circuit component from the plurality of logic circuit components as a time-shared resource. The first logic circuit component and the second logic circuit component are related logic components. The processor-executable instructions further include instructions executable by the processor to connect configurable transmitter or receiver logic with the time-shared resource. The configurable transmitter logic receives a plurality of input threads for the time-shared resource, and the configurable receiver logic sends a plurality of output threads from the time-shared resource.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which:

FIG. 2 shows an example block diagram illustrating an existing mechanism 200 that generates designated TDM hardware to TDM a logic circuit.

FIG. 3 shows an example block diagram illustrating a CAD mechanism 300 that generates soft TDM logic.

DETAILED DESCRIPTION OF THE INVENTION

Unless otherwise indicated, the discussion that follows will be based on an example of a programmable integrated circuit device such as an FPGA. However, it should be noted that the subject matter disclosed herein may be used in any kind of fixed or programmable device, including, but not limited to, an application-specific integrated circuit (ASIC).

Figure 10:
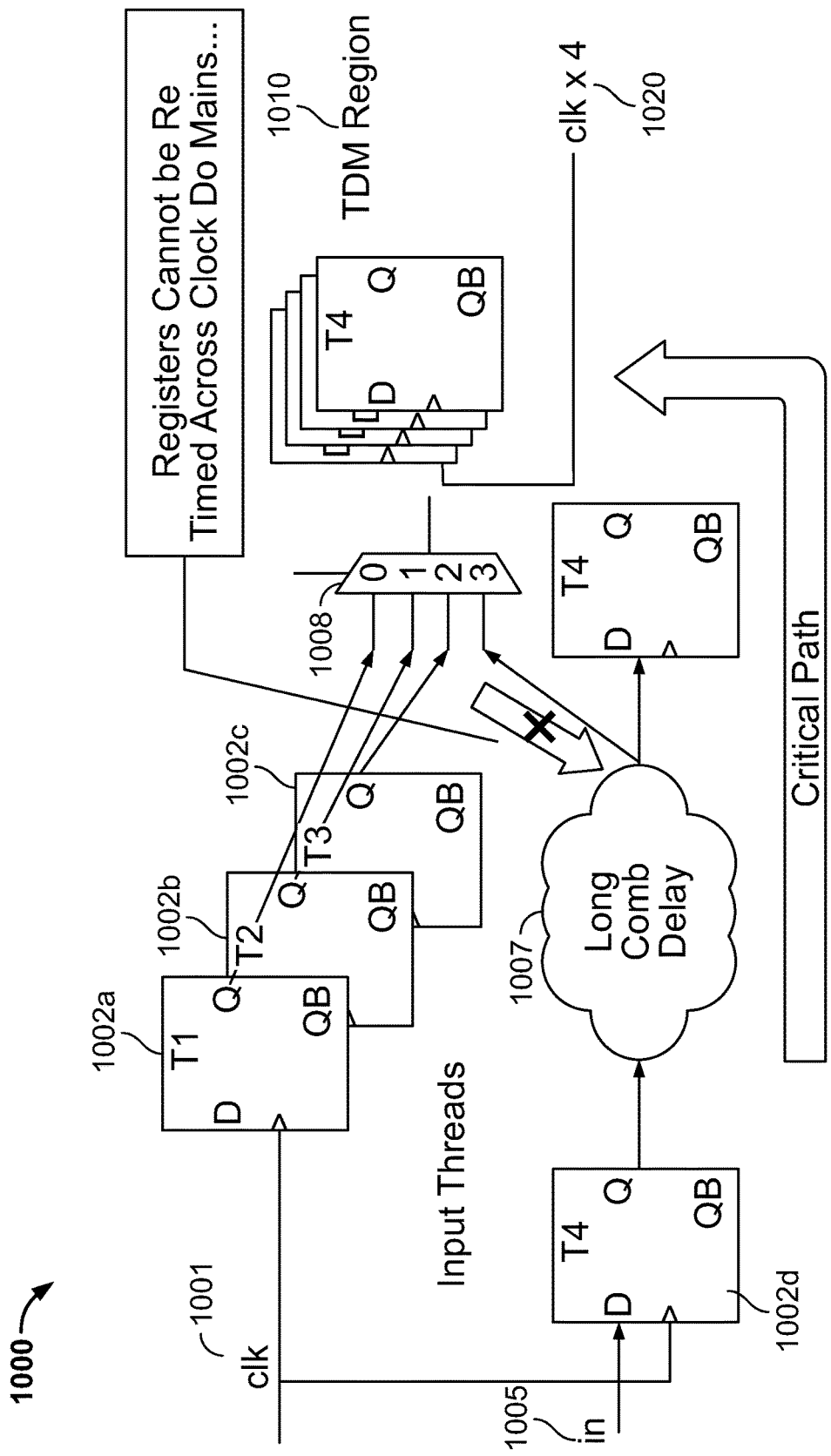
FIGS. 10-11 provide example block diagrams illustrating re-timing between TDM and non-TDM regions.
Figure 11:
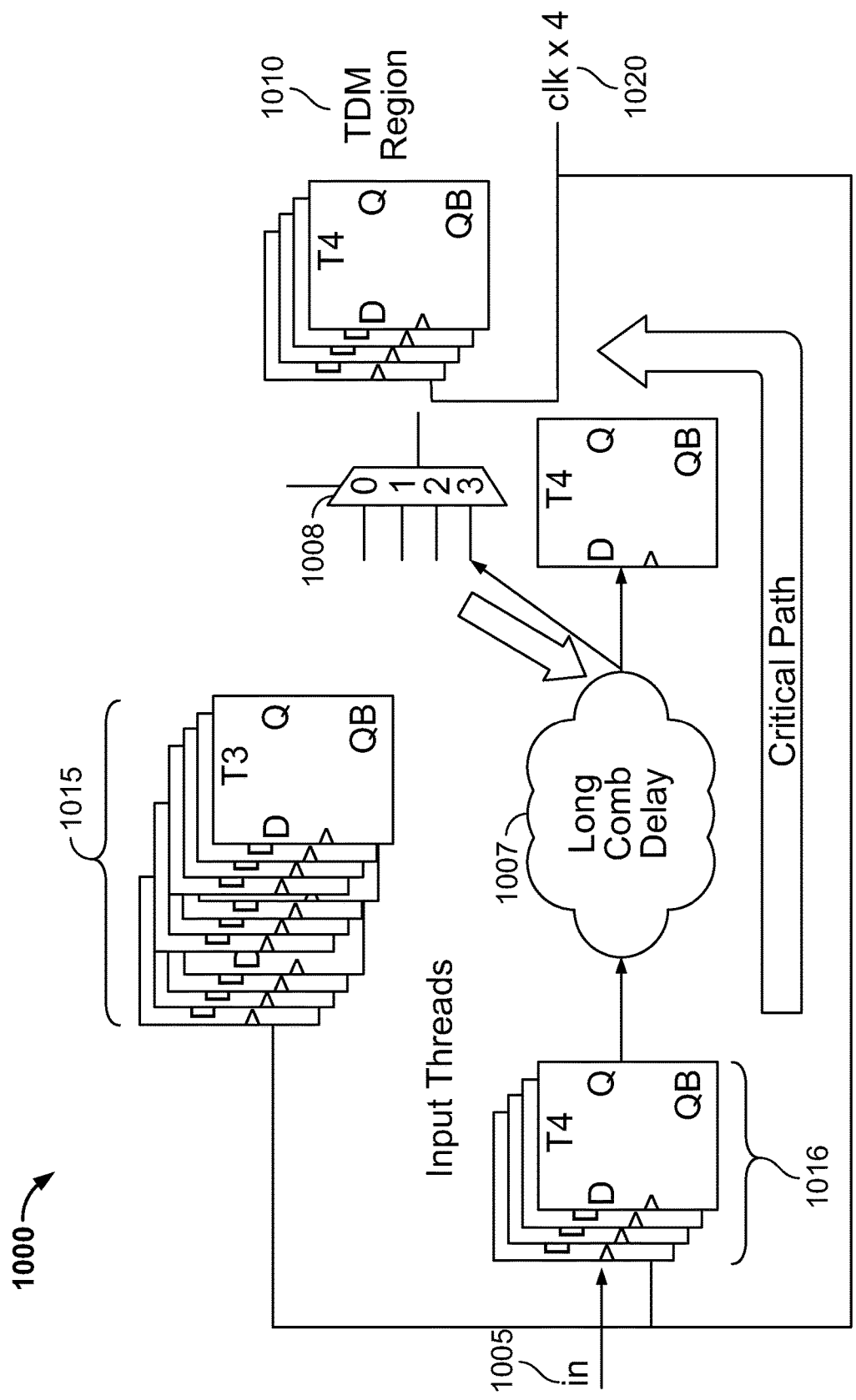

Systems and methods described herein provide CAD tools that can be used to utilize inherent regularity to generate soft TDM hardware to realize a circuit design with increased density. For example, soft transmitter and/or receiver logic can be used in the circuit. The CAD tool can select an optimal TDM region on a programmable circuit to implement a TDM scheme. In this way, by time-sharing the existing resource on the programmable circuit, device density can be increased, especially for circuits containing high FF counts, where the circuit retiming can be done with the FFs as shown in FIGS. 10-11. The flexible soft design described herein can allow a circuit designer to achieve a broad range of functions out of a circuit without completely re-designing the circuit logic, thereby saving on designing costs.

Figure 1:
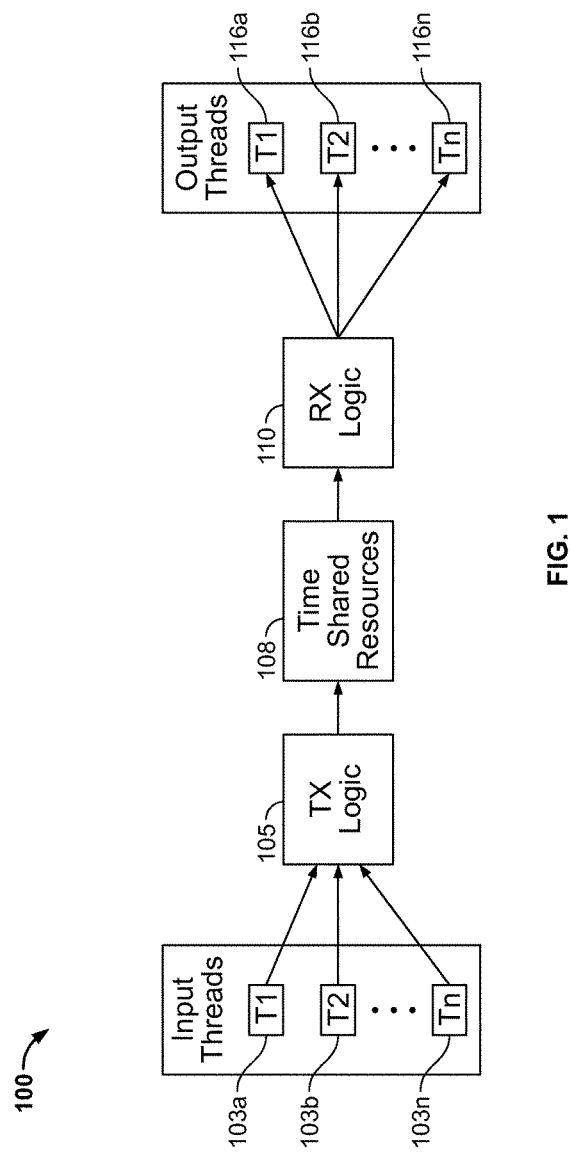
FIG. 1 shows an example block diagram illustrating an example architecture of a TDM system 100 to share resources across time.

FIG. 1 shows an example block diagram illustrating an example architecture of a TDM system 100 to share resources across time. A number of unrelated logic components can share a given resource 108. For example, the unrelated logic components can be structurally or functionally unconnected components on a programmable structure, or components from different circuits or systems, and/or the like. Each of the unrelated logic components can be allocated a slice of time to access and occupy the shared resource 108. Each unrelated logic component can connect to the resource via one of the input threads 103*a-n* and output threads 116*a-n*. The input threads 103*a-n* are multiplexed at a transmitter logic 105, which passes on the input threads to the time-shared resources 108. Outputs from the time-shared resources 108 are then provided to a receiver logic 110, which outputs data to different output threads 116*a-n*. A CAD-driven TDM logic can be used to find reduced overhead for the transmitter logic 105 and receiver logic 110, as is further discussed in FIG. 3.

FIG. 2 shows an example block diagram illustrating an existing mechanism 200 that generates designated TDM hardware to multiplex a logic circuit. User logic circuits 205 can be provided to a CAD tool 206, which assigns logic units from the user logic circuit 205 to fine-grained fully TDM function units. For example, the CAD 206 can multiplex any unrelated logic from the user logic circuit 205 as input threads to generate designated time-domain multiplexed hardware 208. The designated time-domain multiplexed hardware 208 may then work with a number of hardware transmitters 212 and receivers 213 to receive inputs from an external input source and to transmit outputs after data processing by the time-domain multiplexed hardware 208. One or more look-up table (LUT) units 215 may match the transmitter 212 and receiver 213.

FIG. 3 shows an example block diagram illustrating a CAD mechanism 300 that generates soft TDM logic. User logic circuits 305 can be provided to a CAD tool 306. The CAD tool 306, instead of multiplexing any unrelated logic from the user logic 305, can select regions from the user logic 305 to TDM. For example, the CAD tool 306 may selectively multiplex logic components from the user logic 305 that are potentially dependent on or related to one another. For example, the related logic can be functionally or structurally connected or dependent (e.g., connected via I/O, registers, etc.). By multiplexing related logic, the CAD may find a combination of logic to multiplex such that overhead across circuit configurations and inputs can be reduced. The CAD may then assign the related logic to form TDM logic 310 and connect with a transmitter or receiver logic. The transmitter logic 312 or receiver logic 313 can be soft logic that is built with LUTs, which are connected to input threads 314*a-b* or the output threads 316*a-b*, respectively.

Figure 4:
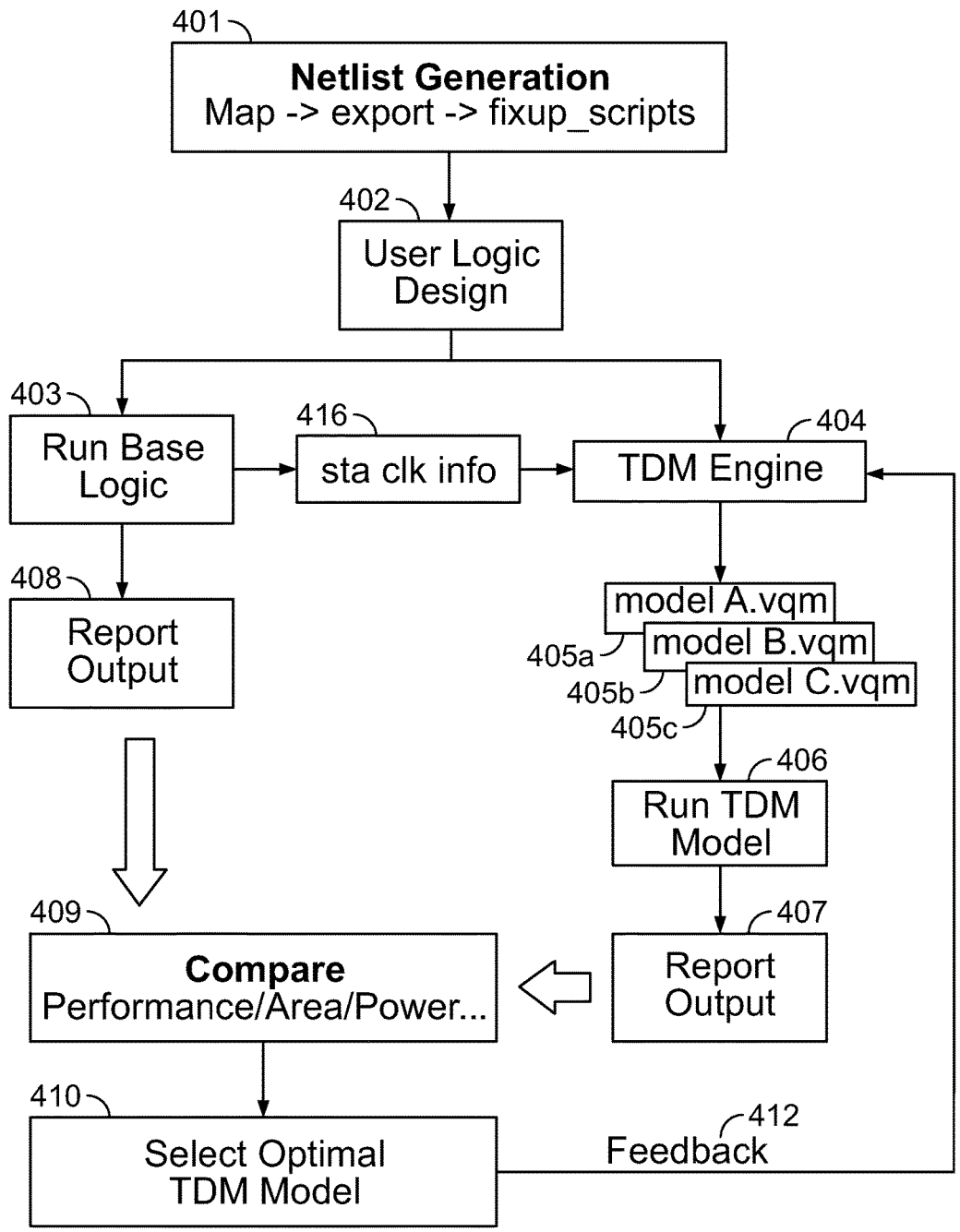
FIG. 4 shows an example flow diagram illustrating aspects of optimizing performance of CAD-driven TDM design.

FIG. 4 shows an example flow diagram illustrating aspects of optimizing performance of a CAD-driven TDM design. In some instances, circuit designs can have large quantities of related logic, in which case TDM can reduce combinational logic. For example, the CAD can determine an amount of related logic that exists in a user-designed circuit, and thus could estimate the net area gain when using soft logic to multiplex logic components in the user-designed circuit. In one implementation, a user-designed circuit map (e.g., in a format of a ".vqm" file, etc.) including a netlist of the circuit can be generated at 401. For example, at 401, a minimum level of circuit optimization can be performed to prevent mangling the netlist. The resulting user logic design 402 (e.g., in a format of a ".vqm" file, etc.) can then be provided to a TDM engine 404. The TDM engine 404 may include CAD tools to find common logic cones from the user logic design 402 and selectively map related logic into threads. In this way, the TDM engine 404 can produce various TDM models 405*a-c*, which can be run at 406 to produce an output report at 407. The outputs can be used to evaluate performance of the user logic design 402 in a time-domain multiplexed fashion.

To compare performance of the multiplexed user logic design 402 and a base non-multiplexed user logic design, base results can be produced at 403 by implementing the user-designed logic without TDM. The base logic can share clock information 416 with the TDM engine 404, such that the TDM engine 404 can use the clock information 416 to select which clocks to TDM. The reported output from 408 and the reported output from 407 can be compared at 409, and the reported outputs 407 from different TDM models are also compared. For example, the area gain (or a similar metric) can be evaluated according to the following:

$$\text{area gain} = \text{TDM region area} \times (\text{number of threads} - 1) - (\text{Input Tx area} + \text{RX area})$$

Another performance metric can be the maximum frequency the circuit could support, which could be evaluated, for example, according to the following:

$$F_{max}=\min(\text{clk\_}f_{max}, \text{TDMclk\_}f_{max}/\text{number of threads})$$

where $F_{max}$ denotes the maximum frequency, clk_$f_{max}$ denotes the clock for the base logic associated with the maximum frequency, and TDMclk_$f_{max}$ denotes the clock for the TDM logic associated with the maximum frequency. Power overhead may also be compared at 409. For example, the dynamic power of the time multiplexed logic can be similar to the dynamic power of the non-multiplexed logic. So the major change in power is the extra static/dynamic power from the receiver/transmitter logic, minus the static power that is removed by combining logic via TDM, e.g., power_delta=(static/dynamic power of the transmitter/receiver_logic)−(static power_tdm_region×(a number of threads −1)). An optimal TDM model may then be selected at 410, and feedback 412 can be provided to the TDM engine 404 for optimizing the TDM model.

Figure 5:
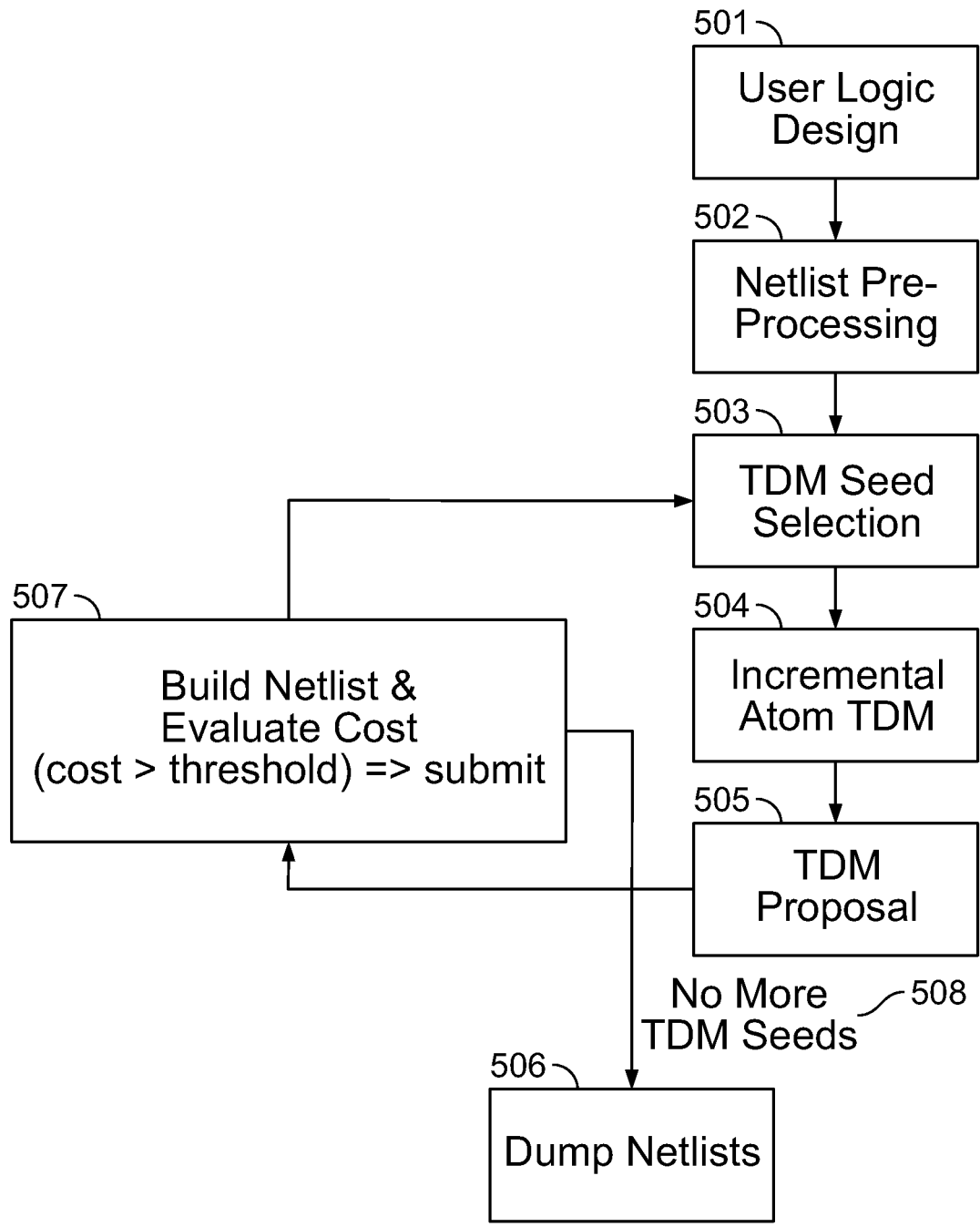
FIG. 5 shows an example flow diagram illustrating aspects of a CAD-driven TDM engine (e.g., similar to 404 in FIG. 4).

FIG. 5 shows an example flow diagram illustrating aspects of a CAD-driven TDM engine (e.g., similar to 404 in FIG. 4). Within a TDM engine, the user logic design 501 can be provided to a netlist pre-processing module 502 to read netlist information of the user-designed circuit and append any information needed by the downstream TDM procedures, e.g., as is discussed in relation to FIG. 6. The CAD tool may then perform TDM seed selection at 503, to select a starting seed for incremental atom TDM, as is discussed in relation to FIG. 7. The incremental atom TDM, as is discussed in relation to FIG. 8, can incrementally grow and optimize the TDM seed to generate a TDM proposal 505 (e.g., proposed TDM regions, number of threads, logic to be time-domain multiplexed, etc.). The CAD may then build a netlist such as the overhead logic needed for the TDM proposal and evaluate a cost of the resulting TDM logic at 507. If the removed logic minus the overhead logic is greater than a predefined threshold, indicating the saved logic achieves a satisfactory level, the CAD may save the TDM proposal as a TDM model output. The CAD may repeatedly perform 507 until no more TDM seeds are available at 508.

For example, to build a netlist at 507, a cost of a TDM input can be amortized across a number of downstream targets (e.g., see 822 in FIG. 8), and an incremental TDM can be performed based on heuristics and cost bounds. At 507, TDM elements can be submitted as a group, and threaded inputs are shared. Threading registers can be added to the threaded inputs to shift the threads. For example, if a TDM region tdm_net_x includes threads with identifiers $T_0$=net1, $T_1$=net$_2$, $T_2$=net$_3$, a TDM register can be added to the input threads such that input tread net1 is shifted to $T_1$ and so on, e.g., with $T_1$=net$_1$, $T_2$=net$_2$. In this way, TDM registers can be added to shift input threads to realize a desired system configuration.

If all the TDM seeds are considered but no TDM proposal generates a saved logic greater than the threshold, the CAD may discard the variations of the netlist at 506. For example, netlist variants may include a base netlist (e.g., unmodified base compile, etc.), a threaded base netlist (including duplicated multi-threading registers, etc.), and various TDM models. For example, the TDM model may include an area model that assumes all TDM flops (e.g., the flops within the TDM region) can be depopulated, e.g., multi-threading registers are not inserted, and router and early retiming switch updates may be able to depopulate a majority of the TDM flops. The TDM model may include a model that maximizes the circuit frequency, by adding TDM registers to all registers within the clock domain, etc. Alternatively, the TDM model may be a basic TDM scheme that only adds TDM registers to time-domain multiplexed regions.

Figure 6:
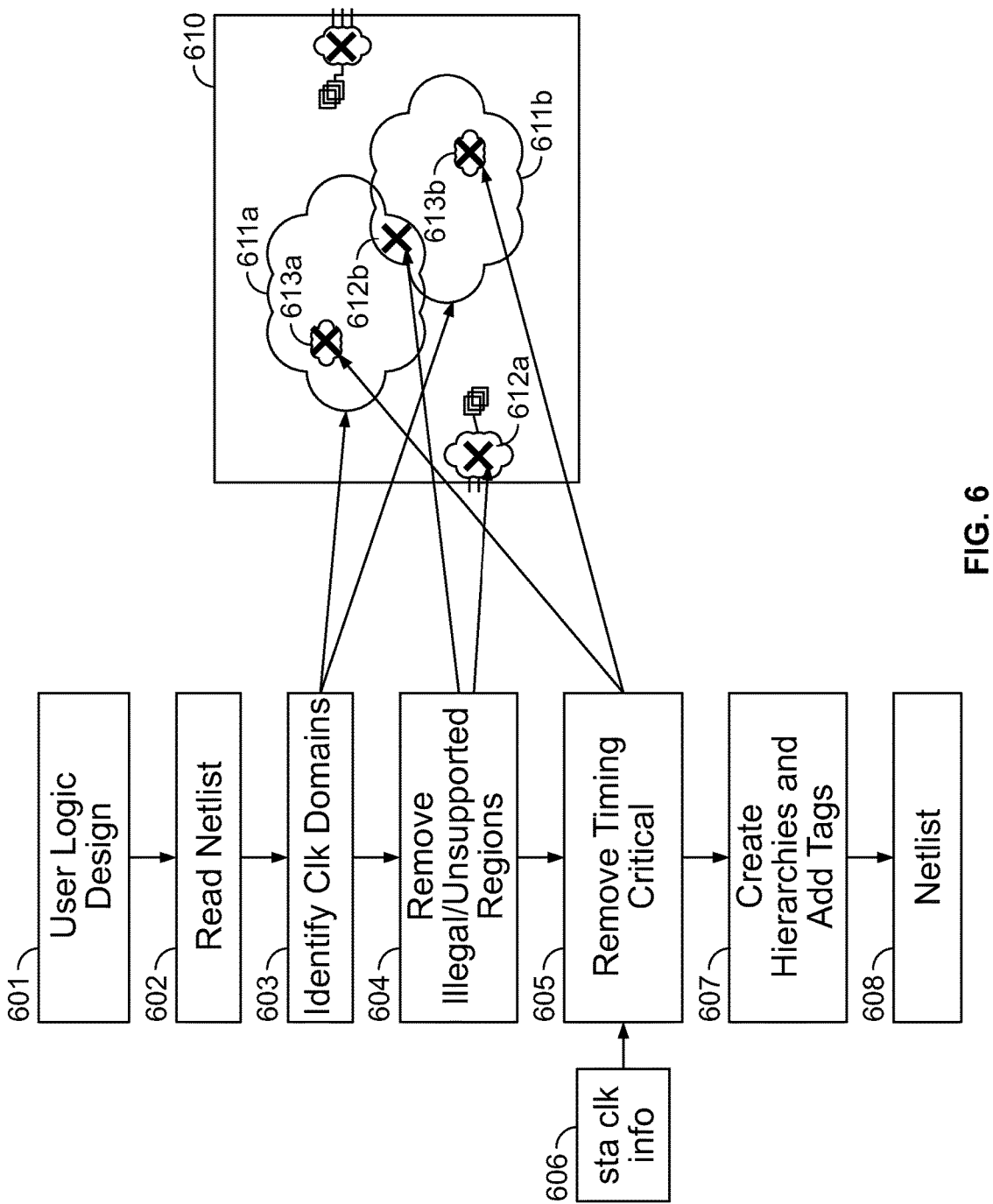
FIG. 6 shows an example flow diagram illustrating aspects for netlist pre-processing (e.g., similar to 502 in FIG. 5).

FIG. 6 shows an example flow diagram illustrating aspects for netlist pre-processing (e.g., similar to 502 in FIG. 5). Upon obtaining the user logic design at 601, the CAD can read a netlist from the user logic design at 602. For example, as is shown in the example user design map 610, the CAD can identify clock regions (e.g., 611*a-b*) within the user logic circuit at 603. At 604, the CAD can remove unsupported regions (e.g., 612*a-b*) from the design 610, such as but not limited to cross-clock logic, unsupported blocks, input/output logic, and/or the like. The CAD may then remove regions that are timing critical at 605, e.g., 613*a-b*. For example, static clock information 606 can be provided and used as timing information. At 607, tags and hierarchies can be added to be used by subsequent TDM routines, such as but not limited to adder configurations, elements counts, bus sizes, and/or the like, and a resulting processed netlist 608 can be generated.

Figure 7:
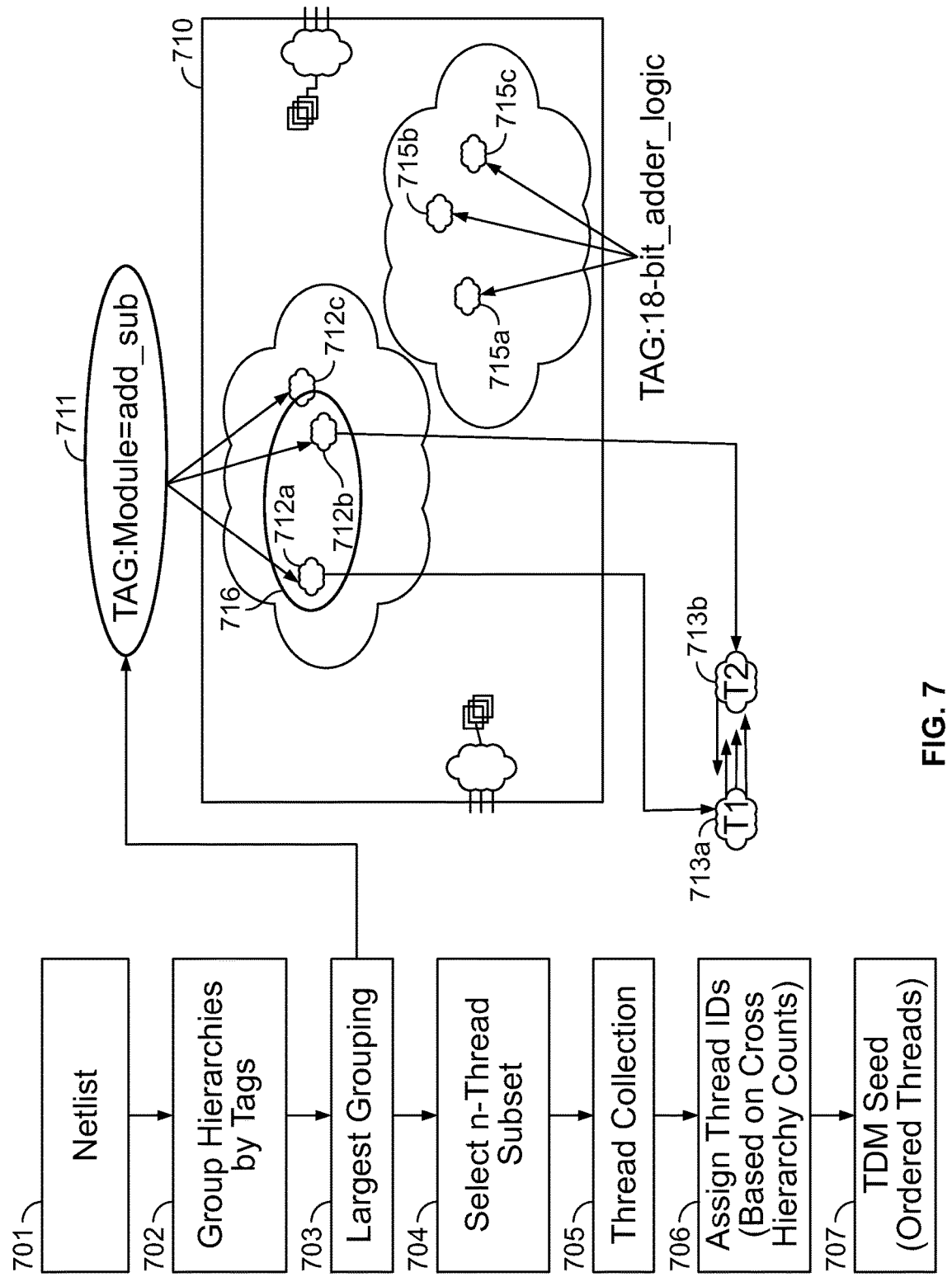
FIG. 7 shows an example flow diagram illustrating aspects for TDM seed selection (e.g., similar to 503 in FIG. 5).

FIG. 7 shows an example flow diagram illustrating aspects for TDM seed selection (e.g., similar to 503 in FIG. 5). The netlist 701 (e.g., the output 608 from FIG. 6) can be used to group hierarchies by the tags at 702. For example, similar looking logic (e.g., with the same clock, same adder structure, similar LUT/REG counts, and/or the like) can be placed in the same group. For example, logic components 715*a-c* can be grouped with the same tag "18-bit_adder-_logic." A large group 703 may include logic with the tag "module-=add_sub," e.g., with adder structures 712*a-c*. A reverse index search can be performed at 704 to select the subset (e.g., 716) of untemplated instances in the large group that have the most matching tags. A number of threads can be collected based on logic components within the subset, at 705. At 706, threat identifiers are assigned based on cross hierarchy counts of the logic instances. For example, moving from T2 (713*b*) to T1 (713*a*) requires a design register and fully serialized/deserialized logic, while moving from T1 (713*a*) to T2 (713*b*) may only require one threading register. The TDM seeds can then be generated with ordered threads at 707.

For example, within the TDM seed hierarchy (e.g., generated at 702 in FIG. 7), the CAD can find the closest matching sub-hierarchy. Tags are weighted based on the potential impact on the TDM overhead. For example, for TDM having two threads, a mismatch in a LUT input requires a total of two extra inputs (including one input for thread state plus two thread inputs, minus one TDM input). A mismatch in LUT mask (e.g., the output values of the combinatorial logic of LUT) may only require one extra input for the thread state. The initial seed may be incrementally grown based on the connectivity. The growth can be driven by exploring input/output (I/O) threads with the highest number of matching tags across threads.

Figure 8:
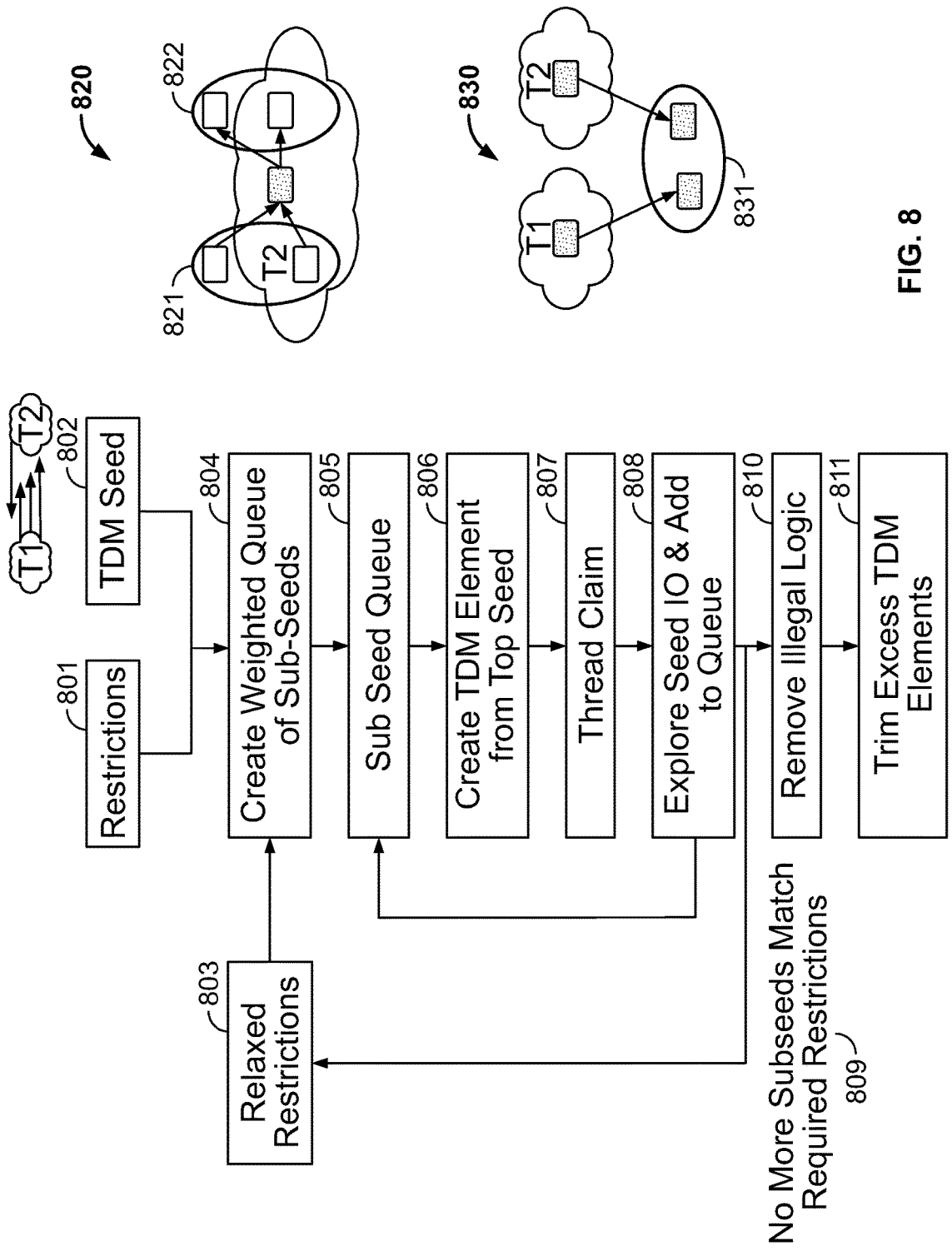
FIG. 8 shows an example flow diagram illustrating aspects for incremental TDM (e.g., similar to 504 in FIG. 5). The incremental TDM may improve the TDM seed selection (as shown in FIG. 7).

FIG. 8 shows an example flow diagram illustrating aspects for incremental TDM (e.g., similar to 504 in FIG. 5). The incremental TDM may improve the TDM seed selection (as shown in FIG. 7). At 801, the CAD may obtain restrictions 801 of the TDM seed selection (e.g., the number of threads is greater than 4, used tags, etc.), and TDM seeds 802 obtained at 707 in FIG. 7. Additional examples of restrictions can be shown at the logic design 820, in which the upstream logic threads 821 can be required to be greater than 2 and the downstream logic threads 822 can be required to be less than 2.

The CAD may then create a weighted queue of sub-seeds at 804, and for each queue 805, the CAD may create a TDM element from a top seed in the queue, by taking the set of similar logic elements and creating a single TDM version of the logic at 806. For example, in the logic design 830, new seed nodes 831 can be weighted based on related connectivity, configuration, and/or the like. The CAD may then perform thread claims at 807, e.g., to assign logic to a particular thread to create minimum or maximum thread restrictions on the up/down stream logic, respectively. The CAD may then explore the seed I/O and add the I/O to the sub-queue. If no more sub-seeds can match the required restriction at 809, the restrictions can be relaxed at 803 and the CAD may repeat the steps 804-808. Upon completing 808, the CAD may remove illegal TDM logic (e.g., an illegal adder chain, etc.) at 810, and trim excess TDM elements such as elements that have negative cost, etc., at 811.

Figure 9:
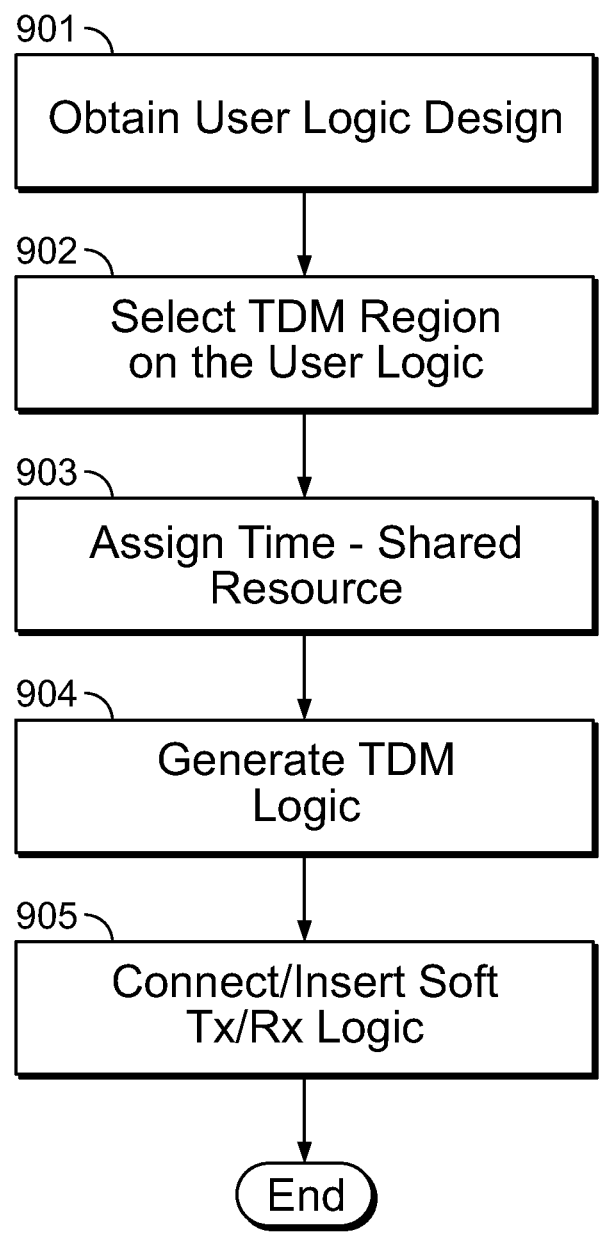
FIG. 9 provides an example logic flow diagram illustrating a CAD tool multiplexing a logic circuit in the time domain.

FIG. 9 provides an example logic flow diagram illustrating a CAD tool multiplexing a logic circuit in the time domain. The CAD tool may obtain a user logic design at 901, and select a TDM region from the user logic circuit at 902. For example, the CAD tool may select one or more logic components from the user logic circuit as a time-shared resource. The one or more logic components can be functionally or structurally connected or dependent (e.g., connected via I/O, registers, etc.). The CAD tool can then assign the one or more logic components as a time-shared resource at 903 and programmably generate a TDM logic at 904. The CAD can programmably connect or insert soft transmitter or receiver logic to the TDM logic at 905, e.g., with the receiver logic receiving and feeding the input threads to the TDM logic, and the transmitter logic sending outputs from the TDM logic to output threads.

FIGS. 10-11 provide example block diagrams illustrating re-timing between TDM and non-TDM regions. Starting with FIG. 10, a clock signal 1001 can be fed to input registers 1002a-d. The input 1005 may have a long combinational delay logic 1007 along its critical path. In this case, the multiplexer 1008 cannot directly connect to outputs of registers 1002a-c and the output from the long combinational delay logic 1007 to select input for the TDM region 1010, because registers cannot be retimed across clock domains. The multiple TDM (e.g., 1010) or non-TDM regions within a clock domain can create multiple blockages for the retime, which may affect the maximum frequency the logic circuit can achieve.

As shown at FIG. 11, a number of TDM registers (e.g., 1015 and 1016) can be added in the time-domain multiplexed clock domain, which may promote all registers to be driven by the same time-domain multiplexed clock. Thus the output of the long combinational delay logic 1007 can then be connected to the multiplexer 1008 for retiming the circuit across regions.

The retiming scheme shown in FIG. 11 can be implemented in a TDM $f_{max}$ model (e.g., as discussed in connection with netlist variants at 506 in FIG. 5). The multi-threading registers (e.g., 1015-1016), when inserted into the circuit, may incur overhead such as FF overhead, quantization effects, etc. A base-threaded TDM model can be implemented to estimate the effect of the insertion multi-treading registers. In addition, the insertion of a multiplexer (e.g., 1008) for serialization may increase the circuit overhead and have an effect on the maximum frequency the circuit can achieve. This effect can be estimated using a TDM area model, e.g., 10-20% $f_{max}$ degradation may be incurred due to this overhead.

For example, $f_{max}$ can be estimated with the logic circuit 1000 by multi-threading all registers in the circuit, and performing a retiming analysis. The multi-threading registers can be incrementally removed until the TDM region 1010 has little impact on limiting $f_{max}$. Thus, the CAD can implement a TDM flow (e.g., as shown in FIG. 4) on the multi-threaded region to incrementally improve the TDM model.

As shown in FIGS. 10-11, an additional clock 1020 (e.g., clock×2, or clock×4, etc.) may need to be supplied to the TDM region, which may require additional clocking resources, and thus lead to clock uncertainty between the base clock 1001 and TDM clock 1020. When the circuit 1000 is operated at TDM frequencies, the clock uncertainty may have an observable impact on $f_{max}$. In this case, a half-TDM can be implemented by double pumping a clean 50/50 clock. For example, a same clock signal can be used across TDM/non-TDM domains, which can reduce the need for changes to the logic design.

In a further implementation, the TDM scheme discussed in relation to FIGS. 1-11 can be applied to a digital signal processing (DSP) circuit on a programmable structure. For example, the DSP may support multi-threading via TDM to achieve area gains. Hardened multiplexers can also be used instead of LUTs, when the latter may incur area or $f_{max}$ overhead at the transmitter input.

Figure 12:
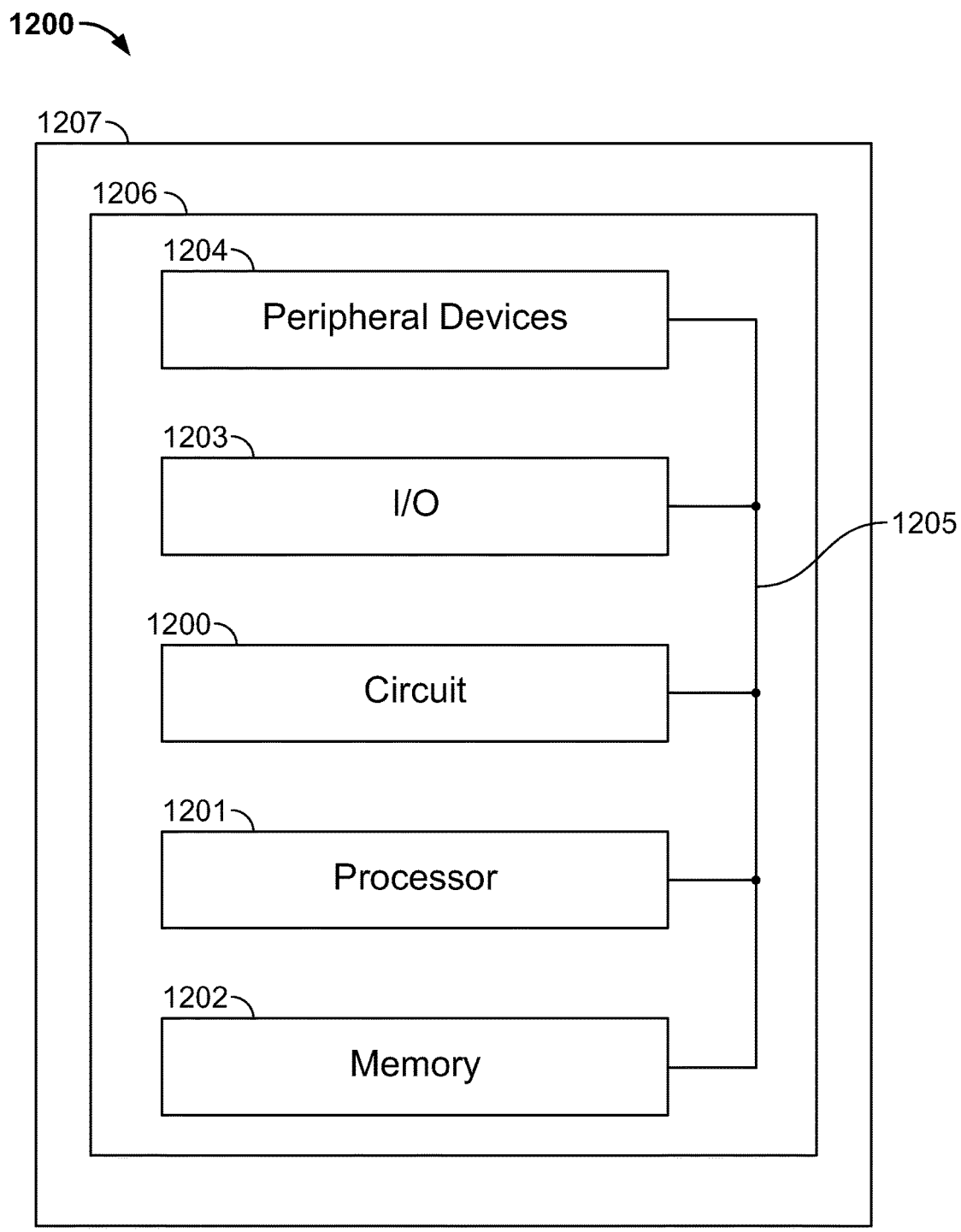
FIG. 12 is a simplified block diagram of an exemplary system employing a programmable logic device incorporating the present invention.

FIG. 12 is a simplified block diagram of an exemplary system employing a programmable logic device incorporating the present invention. A PLD 120 configured to include arithmetic circuitry according to any implementation of the present invention may be used in many kinds of electronic devices. One possible use is in an exemplary data processing system 1200 shown in FIG. 12. Data processing system 1200 may include one or more of the following components: a processor 1201; memory 1202; I/O circuitry 1203; and peripheral devices 1204. These components are coupled together by a system bus 1205 and are populated on a circuit board 1206 which is contained in an end-user system 1207.

System 1200 can be used in a wide variety of applications, such as computer networking, data networking, instrumentation, video processing, digital signal processing, Remote Radio Head (RRH), or any other application where the advantage of using programmable or reprogrammable logic is desirable. PLD 120 can be used to perform a variety of different logic functions. For example, PLD 120 can be configured as a processor or controller that works in cooperation with processor 1201. PLD 120 may also be used as an arbiter for arbitrating access to shared resources in system 1200. In yet another example, PLD 120 can be configured as an interface between processor 1201 and one of the other components in system 1200. It should be noted that system 1200 is only exemplary, and that the true scope and spirit of the invention should be indicated by the following claims.

Various technologies can be used to implement PLDs 120 as described above and incorporating this invention.

Figure 13:
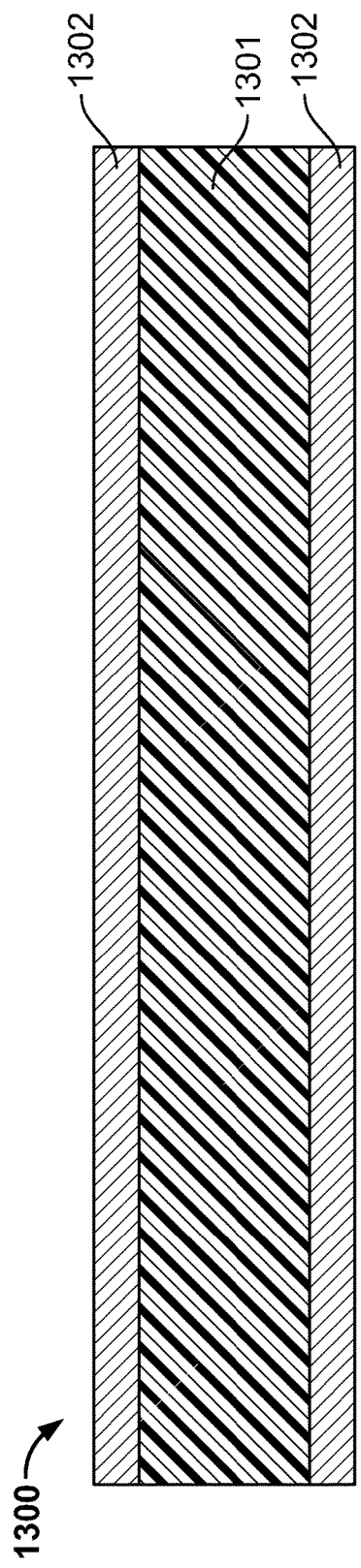
FIG. 13 presents a cross section of a magnetic data storage medium 1300 which can be encoded with a machine executable program that can be carried out by systems such as the aforementioned personal computer, or other computer or similar device.

FIG. 13 presents a cross section of a magnetic data storage medium 1300 which can be encoded with a machine executable program that can be carried out by systems such as the aforementioned personal computer, or other computer or similar device. Medium 1300 can be a floppy diskette or hard disk, or magnetic tape, having a suitable substrate 1301, which may be conventional, and a suitable coating 1302, which may be conventional, on one or both sides, containing magnetic domains (not visible) whose polarity or orientation can be altered magnetically. Except in the case where it is magnetic tape, medium 1300 may also have an opening (not shown) for receiving the spindle of a disk drive or other data storage device.

The magnetic domains of coating 1302 of medium 1300 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 14:
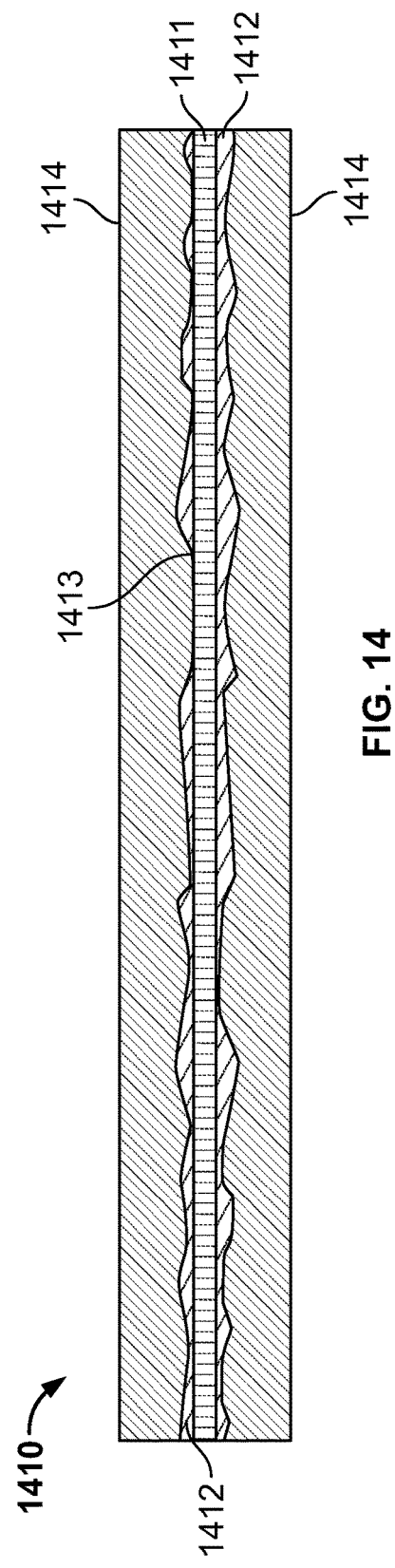
FIG. 14 shows a cross section of an optically-readable data storage medium 1410 which also can be encoded with such a machine-executable program, which can be carried out by systems such as the aforementioned personal computer, or other computer or similar device.

FIG. 14 shows a cross section of an optically-readable data storage medium 1410 which also can be encoded with such a machine-executable program, which can be carried out by systems such as the aforementioned personal computer, or other computer or similar device. Medium 1410 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1410 preferably has a suitable substrate 1411, which may be conventional, and a suitable coating 1412, which may be conventional, usually on one or both sides of substrate 1411.

In the case of a CD-based or DVD-based medium, as is well known, coating 1412 is reflective and is impressed with a plurality of pits 1413, arranged on one or more layers, to encode the machine-executable program. The arrangement of pits is read by reflecting laser light off the surface of coating 1412. A protective coating 1414, which preferably is substantially transparent, is provided on top of coating 1412.

In the case of magneto-optical disk, as is well known, coating 1412 has no pits 1413, but has a plurality of magnetic domains whose polarity or orientation can be changed magnetically when heated above a certain temperature, as by a laser (not shown). The orientation of the domains can be read by measuring the polarization of laser light reflected from coating 1412. The arrangement of the domains encodes the program as described above.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A processor-implemented method for multiplexing a logic circuit in time domain, the method comprising:
    obtaining, via the processor, information relating to a plurality of logic circuit components, wherein the plurality of logic circuit components are built on a programmable structure; and
    selectively assigning, via the processor, a first logic circuit component and a second logic circuit component from the plurality of logic circuit components, as a time-shared resource via implementation by a computer-aided design tool, wherein:
        the computer-aided design tool removes unsupported clock regions from the plurality of logic circuit components;
        the first logic circuit component and the second logic circuit component are related logic components that are functionally or structurally connected, dependent, or both; and
    connecting, via the processor, configurable logic with the time-shared resource, wherein:
        the configurable logic includes configurable receiver logic that receives an output from the time-shared resource and outputs to a plurality of output threads or configurable transmitter logic that transmits an input from a plurality of input threads to the time-shared resource.

2. The method of claim 1, wherein the configurable transmitter or receiver logic includes soft logic built on a programmable structure.

3. The method of claim 1, wherein the configurable transmitter or receiver logic includes a look-up table logic.

4. The method of claim 1, wherein the first logic circuit component and the second logic circuit component are connected via an input, an output, a register, or any combination thereof.

5. The method of claim 1, wherein the first logic circuit component and the second logic circuit component are selected from the plurality of logic circuit components based on a reduced overhead associated with the first logic circuit component and the second logic circuit component.

6. A processor-implemented method for multiplexing a logic circuit in time domain, the method comprising:
    obtaining, via the processor, information relating to a plurality of logic circuit components that are functionally or structurally connected, dependent, or both, wherein the plurality of logic circuit components are built on a programmable structure;
    selectively creating, via the processor, one or more time-domain multiplexed (TDM) logic models from the plurality of logic circuit components remaining once a computer-aided design tool removes unsupported clock regions from the plurality of logic circuit components;
    instantiating, via the processor, the one or more time-domain multiplexed logic models to obtain performance data; and
    comparing, via the processor, the performance data associated with two or more time-domain multiplexed logic models to select an optimal TDM logic model from the two or more TDM logic models.

7. The method of claim 6, wherein the selectively creating two or more TDM logic models includes selectively adding soft transmitter or receiver logic from a programmable structure.

8. The method of claim 6, wherein the two or more TDM logic models are created by locating common logic cones from the plurality of logic circuit components and mapping the common logic cones to a plurality of threads.

9. The method of claim 6, wherein the performance data includes any of a maximum circuit frequency, area gain or power overhead.

10. The method of claim 6, wherein the selectively creating two or more time-domain multiplexed (TDM) logic models further includes incrementally optimizing the two or more TDM logic models.

11. The method of claim 6, wherein the selectively creating two or more time-domain multiplexed (TDM) logic models includes:
    generating a netlist of the plurality of logic circuit components;
    generating a hierarchy of the plurality of logic circuit components; and
    assigning the plurality of logic circuit components to one or more threads based on the hierarchy.

12. The method of claim 6, wherein the selectively creating two or more time-domain multiplexed (TDM) logic models includes:

configurably adding TDM registers to one or more input threads of the two or more TDM logic models.

13. The method of claim 6, wherein the selectively creating two or more TDM logic models is performed by a computer-aided design tool.

14. Circuitry for multiplexing a logic circuit in time domain, the circuitry comprising:
   time-domain multiplexed (TDM) logic generated by selectively assigning one or more related logic components as a time-shared resource via a computer-aided design tool, wherein:
      the computer-aided design tool removes unsupported clock regions from the plurality of logic circuit components; and
      the one or more related logic components are functionally or structurally connected, dependent, or both;
   configurable transmitter soft logic transmitting an input received from one or more input threads to the TDM logic; and
   configurable receiver soft logic receiving an output from the TDM logic and outputting the output to one or more output threads.

15. The circuitry of claim 14, wherein the circuitry is built on a programmable structure.

16. The circuitry of claim 14, wherein the one or more related logic components are connected via an input, an output, a register, or any combination thereof.

17. The circuitry of claim 14, wherein the selectively assigning one or more related logic components as the time-shared resource is performed by a computer-aided design tool.

18. A processor-readable non-transitory medium storing processor-executable instructions for multiplexing a logic circuit in time domain, the processor-executable instructions comprising:
   instructions executable by a processor to obtain information relating to a plurality of logic circuit components, wherein the plurality of logic circuit components are built on a programmable structure;
   instructions executable by the processor to selectively assign, via a computer-aided design tool, a first logic circuit component and a second logic circuit component from the plurality of logic circuit components as a time-shared resource, wherein:
      the computer-aided design tool removes unsupported clock regions from the plurality of logic circuit components;
   the first logic circuit component and the second logic circuit component are related logic components that are functionally or structurally connected, dependent, or both; and
   instructions executable by the processor to connect configurable logic with the time-shared resource, wherein:
      the configurable logic includes configurable receiver logic that receives an output from the time-shared resource and outputs to a plurality of output threads or configurable transmitter logic that transmits an input from a plurality of inputs threads to the time-shared resource.

* * * * *